Figure 1:
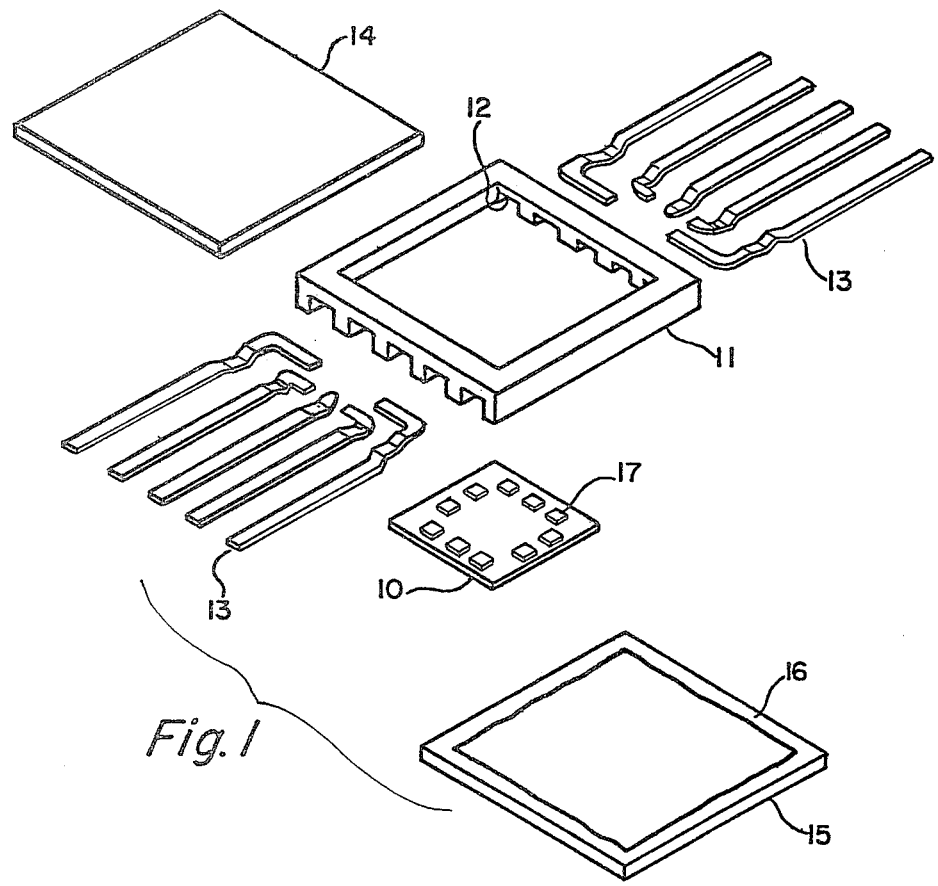

United States Patent [19]

Ritchie et al.

[11] 4,427,992
[45] Jan. 24, 1984

[54] METHOD FOR INCORPORATING A DESICCANT IN A SEMICONDUCTOR PACKAGE

[75] Inventors: Kim Ritchie, Phoenix; James N. Smith, Tempe, both of Ariz.

[73] Assignee: Motorola, Inc., Schaumburg, Ill.

[21] Appl. No.: 851,337

[22] Filed: Nov. 14, 1977

Related U.S. Application Data

[60] Continuation of Ser. No. 641,866, Dec. 17, 1975, which is a division of Ser. No. 475,723, Jun. 3, 1974.

[51] Int. Cl.³ .............................................. H01L 23/36
[52] U.S. Cl. ...................................... 357/78; 252/194; 427/93; 427/82
[58] Field of Search ................. 252/194, 181.1, 181.6; 357/78; 427/93, 82

[56] References Cited

U.S. PATENT DOCUMENTS

| | | | |
|---|---|---|---|
| 2,683,667 | 7/1954 | Utter | 252/194 |
| 3,528,169 | 9/1970 | Pervin et al. | 357/78 |
| 3,586,926 | 6/1971 | Nakamura et al. | 357/78 |
| 3,789,023 | 1/1974 | Ritchie | 252/518 |

*Primary Examiner*—J. L. Barr
*Attorney, Agent, or Firm*—Paul F. Wille

[57] ABSTRACT

A desiccant for semiconductor packaging which may be applied in liquid form consists essentially of approximately 60% by weight absolute ethyl alcohol, 25% by weight ethyl acetate, 5% by weight water, 5% by weight a source of boron, aluminum or phosphorus and 5% by weight of an organic silane having the structural formula:

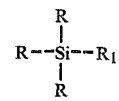

where $R_1$ is a radical selected from the group consisting of $H-$, $CH_2=CH-$, $CH_3O-$, $C_2H_5O-$, $CH_3CO_2-$, $C_2H_5CO-$, and $C_3H_7O-$, and R is a radical selected from the group consisting of $CH_3O-$, $C_2H_5O-$, $C_3H_7O-$, $CH_3CO_2-$, $C_2H_5CO_2-$, $Si^+$, $OH-$, and $O-$. The sources of boron, aluminum, and phosphorus may be halides, oxides or nitrates. Also a process for incorporating the foregoing into semiconductor package and process for formulating the above solution.

8 Claims, 2 Drawing Figures

METHOD FOR INCORPORATING A DESICCANT IN A SEMICONDUCTOR PACKAGE

This is a continuation of application Ser. No. 641,866, filed Dec. 17, 1975, which is a divisional of Ser. No. 475,723, filed June 3, 1974.

BACKGROUND OF THE INVENTION

This invention relates to semiconductor devices and more particularly to the composition and process for eliminating corrosion within semiconductor packages.

Semiconductor devices, particularly semiconductor integrated circuits, are formed in a semiconductor chip or die, for example, of silicon, by standard photolithographic and diffusion techniques and then provided with suitable metallized bonding pads. The completed chip is placed in the suitable packaging structure having electric leads therethrough for providing electrical connection between interiors of the package and the circuit or system into which it is to be connected. The circuit between the chip and the package leads is completed by bonding wires. Typically, the bonding pads on the chip and the bonding wires are of aluminum. One prevalent problem with this type of package is that corrosion takes place between the aluminum bonding wire and the aluminum bonding pad thus resulting in early failure of otherwise operative semiconductor integrated circuit chips. This problem has been especially found in CMOS (complementary metal oxides semiconductor) integrated circuits packaged in dual-in-line ceramic packages. Although these packages are considered and intended to be hermetically sealed, it has been found that a certain amount of carbon dioxide and water is present in the packaged device. Hence, a mechanism for eliminating or gettering of this carbon dioxide and water vapor has been found to be necessary.

OBJECTS OF THE INVENTION

It is therefore an object of this invention to provide an improved desiccant or gettering agent for a semiconductor integrated circuit.

A further object of the invention is to provide a desiccant or getter for water vapor and carbon dioxide in semiconductor packages.

Still more particularly, it is an object of this invention to provide a desiccant or gettering material for semiconductor integrated circuits in ceramic packages.

A still further object of the invention is to provide a method of manufacturing semiconductor integrated circuits which includes the steps of placing and retaining desiccant into the package.

A further object of the invention is to provide a method of manufacture of a desiccant or gettering material for semiconductor devices.

SUMMARY OF THE INVENTION

In accordance with the foregoing object there is provided a desiccant for semiconductor packaging consisting essentially of approximately 60% by weight absolute ethyl alcohol, 25% by weight ethyl acetate, 5% by weight water, 5% by weight of a source of boron, aluminum, or phosphorous and 5% by weight of an organic silane having the structural formula:

where $R_1$ is a radical selected from the group consisting of $H^-$, $CH_2=CH^-$, $CH_3O^-$, $C_2H_5O^-$, $CH_3CO_2^-$, $C_2H_5CO^-$, and $C_3H_7O^-$, and R is a radical selected from the group consisting of $CH_3O^-$, $C_2H_5O^-$, $C_3H_7O^-$, $CH_3CO_2^-$, $C_2H_5CO_2^-$, $Si^+$, $OH^-$, and $O^-$.

There is also provided a method of utilizing the foregoing desiccant material which includes the steps of (a) providing the ingredients 17% to 23% ethyl alcohol, 3% to 9% water and 0.1% to 10% of a metallic ion selected from the group consisting of boron, aluminum, and phosphorous, and the halides, oxides and nitrates thereof; (b) refluxing said ingredients of alcohol, water and metallic ion source until reaction thereof is essentially complete; (c) adding to said refluxed ingredients 36% to 42% by weight ethyl alcohol, 17% to 23% by weight ethyl acetate and 9% to 15% by weight of tetra-ethylorthosilicate; and (d) coating the resulting solution on at least a portion of a semiconductor package.

There is also provided a method of packaging semiconductor devices which includes the step of coating a portion of the semiconductor package with a liquid material consisting essentially of approximately 60% by weight ethyl alcohol, 25% by weight of a source of boron, aluminum or phosphorous and 5% by weight of an organic silane and having the structural formula:

where $R_1$ is a radical selected from the group consisting of $H^-$, $CH_2=CH^-$, $CH_3O^-$, $C_2H_5O^-$, $CH_3CO_2^-$, $C_2H_5CO^-$, and $C_3H_7O^-$ and R is a radical selected from the group consisting of $CH_3O^-$, $C_2H_5O^-$, $C_3H_7O^-$, $CH_3CO_2^-$, $C_2H_5CO_2^-$, $Si^+$, $OH^-$, $O^-$.

THE DRAWINGS

Figure 2:
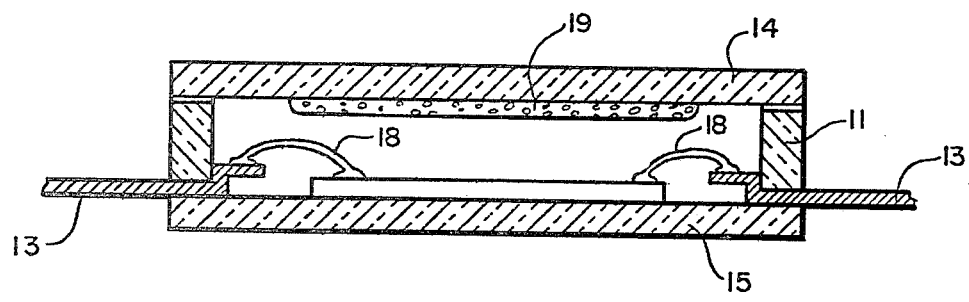

Further objects and advantages of the invention will be understood from the following complete description thereof and from the drawings wherein:

FIG. 1 is an expanded view of a semiconductor package embodying the invention; and FIG. 2 is a cross-section thereof.

COMPLETE DESCRIPTION

The sealing of semiconductor devices in packages may be accomplished in a low dew point atmosphere of air, an inert gas atmosphere, or a vacuum. During such processing every effort has been made to prevent materials, such as water vapor and carbon dioxide from being contained in the package. However, as integrated circuits have gotten smaller and more complex, smaller amounts of carbon dioxide and water vapor can lead to corrosion of the device internal of the package. Since a certain amount of water vapor and carbon dioxide is probably placed in the package, merely from the material being used to seal the package, it is necessary to provide a desiccant or gettering agent within the package which does not produce deleterious results. Normal gettering material such as might be used for receiving tubes or electronic devices of other types is not suitable since most of these desiccants rely upon chemical combination utilizing materials which themselves would present chemical damage to the semiconductor chip.

In accordance with the preferred embodiment of the invention, a suitable desiccant is provided by mixing absolute ethyl alcohol of about 20% by weight and distilled deionized water of about 3% by weight with a metal ion source of aluminum, boron or phosphorous of about 3% by weight. Such source of aluminum, boron or phosphorous ion may be a halide, oxide or nitrate. These three ingredients are refluxed until the reaction thereof is essentially complete. Generally, this takes place in the order of about one-half hour. Following filtering of the refluxed ingredients another 39% by weight of absolute ethyl alcohol, 3% by weight of glycerol and approximately 25% by weight of ethyl acetate and approximately 12% by weight of an organic silane having the structural formula:

wherein $R_1$ is a radical selected from the group consisting of $H^-$, $CH_2=CH^-$, $CH_3O^-$, $C_2H_5O^-$, $CH_3CO_2^-$, $C_2H_5CO^-$, and $C_3H_7O^-$, and R is a radical selected from the group consisting of $CH_3O^-$, $C_2H_5O^-$, $C_3H_7O^-$, $CH_3CO_2^-$, and $C_2H_5CO_2^-$. Preferably this material is tetraethylorthosilicate.

The above results in a liquid desiccant coating comprising and combination by weight 59% absolute ethyl alcohol, 20% ethyl acetate, 12% tetraethylorthosilicate and 3% each of water, gylcerol and a metal ion source such as phosphorous, boron or aluminum. A coating of this material is placed on at least some parts of the semiconductor package and dried at 80°–200° C. for 10–30 minutes. This produces a porous silicon coating having a density of 1.4 to 1.8 as contrasted with ordinary $SiO_2$ which has a density of 2.3.

As shown in FIG. 1, a semiconductor package for a semiconductor integrated circuit chip 10 is enclosed in a package comprising four basic structures:

(a) a box-like ceramic mounting base 11 with castellations 12 to act as a jig for the external leads 13; (b) and a top cover 14; (c) a bottom cover 15; and (d) leads 13 which are normally provided in a single sheet of metal with surrounding frame (not shown) which is later trimmed off.

The frame holding the leads serves to hold the leads in the castellated base 11 while the leads 13 are sealed thereto with a solder glass. Following securing of the leads 13 in the base member 11, the bottom lid 15 is secured thereto. Typically, a solder glass coating 16 is provided about the periphery of the cover 15 and the cover is then juxtaposed with the base 11 which has sealed-in leads 13. If desired the leads 13, the base member 11, and the bottom cover 15 may be assembled in a single operation by heating these three major member together at a high enough temperature to cause the solder glass to flow.

The semiconductor chip 10 having a plurality of bonding pads 17 is then placed in this assembly and bonding wire 18 (FIG. 2) connect the bonding pads 17 to the respective lead members 13. A top cover 14 is then prepared by placing a solder glass coating about its periphery and the coating of the above-referred-to desiccant in the central area thereof. The top cover 14 is then dried at 80°–200° C. for 10–30 minutes resulting in a porous coating 19 on the interior surface of the top cover 14. The top cover 14 is then placed on the semiconductor package and heated at 200°–500° C. for about 10–30 minutes to effect the sealing of the glass solder to the base member 11, completing the package.

The foregoing treatment results in a coating which adheres well to the package cover 14 and has a large affinity for water. It is theorized that the following structure and reaction takes place:

Structure:

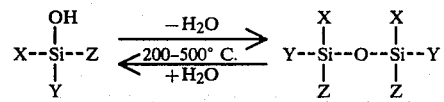

Where X, Y & Z could be Si, O, OH in various stoichimetries containing certain percentages of Al, B, P. The small amounts of Al, B, or P increases adhesion to similar materials, i.e., introduction of Al promotes better adhesion to $Al_2O_3$ based ceramics.

Thus the foregoing results in a complex silicate having several dangling bonds which mechanically and/or chemically absorb the carbon dioxide and water remaining in the package. Comparative data has demonstrated that a package made by prior technique without the desiccant coating contains about 0.6 volume % water and approximately 5 volume % carbon dioxide. With use of the desiccant it is found that the water content is reduced below 0.2% and carbon dioxide below 3%. It is thus deemed that the desiccant in accordance with the invention removes 66% of the water and approximately one-half of the $CO_2$ leading to devices which have increased life.

While the invention has been disclosed by way of the preferred embodiment thereof it will be appreciated that suitable modifications may be made therein without departing from the spirit and scope of the invention.

What is claimed is:

1. A method of packaging a semiconductor chip in a hermetic enclosure formed by assembly of a first enclosure portion bearing said semiconductor chip to a second enclosure portion, said enclosure including a desiccant, the improvement comprising placing a coating of a liquid material consisting essentially of ethyl alcohol, water, ethyl acetate, tetraethylorthosilicate, and 0.1% to 10% by weight of a metallic ion selected from the group consisting of boron, aluminum, and phosphorus, on part of said second enclosure portion prior to said assembly, and drying said coating in the range 80°–500° C. to provide a desiccant adherent to said second enclosure portion.

2. The method of claim 1 where said metallic ion is aluminum.

3. The method of claim 1, where the source of said metallic ion comprises the halides, oxides, and nitrates of said group.

4. The method of claim 1, where the weight percentage of tetraethylorthosilicate in said liquid material is greater than the percentage of said metallic ion and less the percentage of ethyl alcohol and the percentage of ethyl acetate.

5. A method of packaging a semiconductor device as recited in claim 1 and further including the steps of drying said coating at 80°–200° C. to form a porous complex silicate adhering to said second enclosure portion.

6. The method of claim 5, where said silicate has a density of 1.4–1.8.

7. A method of packaging a semiconductor device as recited in claim 1, 5 or 6 and further including the step of exposing said coating to a temperature of 200°–500° C. for 10–30 minutes during the assembly of said enclosure portions.

8. A method of packaging a semiconductor chip in a hermetic enclosure formed by assembly of a first enclosure portion bearing said semiconductor chip to a second enclosure portion, said enclosure including a desiccant, the improvement comprising placing a coating of a liquid material consisting essentially of ethyl alcohol, water, ethyl acetate, 0.1% to 10% by weight of a metallic ion selected from the group consisting of boron, aluminum, and phosphorus, and an organic silane having the structural formula

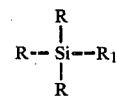

where $R_1$ is a radical selected from the group consisting of H—, $CH_2$=CH—, CH3O—, $C_2H_5O$—, $CH_3CO_2$—, $C_3H_7O$—, and R is selected from the group consisting of $CH_3O$—, $C_2H_5O$—, $C_3H_7O$—, $CH_3CO_2$—, and $C_2H_5CO_2$— on part of said second enclosure portion prior to said assembly, and drying said coating in the range 80°–500° C. to provide a desiccant adherent to said second enclosure portion.

* * * * *

UNITED STATES PATENT AND TRADEMARK OFFICE
CERTIFICATE OF CORRECTION

PATENT NO. : 4,427,992

DATED : January 24, 1984

INVENTOR(S) : Kim Ritchie and James N. Smith

It is certified that error appears in the above-identified patent and that said Letters Patent is hereby corrected as shown below:

Claim 4, line 3, after "less" and before "the", insert
--than--.

Signed and Sealed this

Twenty-fourth Day of April 1984

[SEAL]

Attest:

GERALD J. MOSSINGHOFF

Attesting Officer    Commissioner of Patents and Trademarks